United States Patent
Choi et al.

(10) Patent No.: US 9,177,887 B2
(45) Date of Patent: Nov. 3, 2015

(54) SEMICONDUCTOR TEST DEVICE AND METHOD FOR FABRICATING THE SAME

(71) Applicant: Samsung Electronics Co., Ltd., Suwon-si, Gyeonggi-Do (KR)

(72) Inventors: Mi-Na Choi, Yongin-si (KR); Ji-Chul Kim, Yongin-si (KR); Se-Ran Bae, Yongin-si (KR); Eun-Seok Cho, Suwon-si (KR); Hee-Jung Hwang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 175 days.

(21) Appl. No.: 14/068,091

(22) Filed: Oct. 31, 2013

(65) Prior Publication Data
US 2014/0239300 A1 Aug. 28, 2014

(30) Foreign Application Priority Data

Feb. 26, 2013 (KR) .................. 10-2013-0020636

(51) Int. Cl.
| | |
|---|---|
| *H01L 23/48* | (2006.01) |
| *H01L 23/34* | (2006.01) |
| *G01R 31/28* | (2006.01) |
| *H01L 21/66* | (2006.01) |
| *H01L 23/00* | (2006.01) |

(52) U.S. Cl.
CPC .......... *H01L 23/345* (2013.01); *G01R 31/2875* (2013.01); *H01L 23/34* (2013.01); *H01L 22/34* (2013.01); *H01L 24/16* (2013.01); *H01L 2224/16225* (2013.01); *H01L 2924/15311* (2013.01)

(58) Field of Classification Search
CPC ........................................................ H01L 22/30
USPC ............................................... 257/48, E23.01
See application file for complete search history.

(56) References Cited

U.S. PATENT DOCUMENTS

| | | | |
|---|---|---|---|
| 4,730,160 | A | 3/1988 | Cusack et al. |
| 5,302,022 | A | 4/1994 | Huang et al. |
| 6,559,667 | B1 | 5/2003 | Tarter |
| 6,770,906 | B2 | 8/2004 | Corbett et al. |
| 6,966,693 | B2 | 11/2005 | Prakash et al. |
| 9,006,000 | B2 * | 4/2015 | Hanan et al. ............. 438/11 |

(Continued)

FOREIGN PATENT DOCUMENTS

| | | |
|---|---|---|
| JP | 11067862 | 3/1999 |
| JP | 4086597 B2 | 5/2008 |

(Continued)

*Primary Examiner* — Cuong Q Nguyen

(74) *Attorney, Agent, or Firm* — Harness, Dickey & Pierce, P.L.C.

(57) ABSTRACT

Semiconductor test devices and methods for fabricating the same may be provided. The semiconductor test device may include a first thermal test flip chip cell including a first heater and a first sensor, and a test substrate formed under the first thermal test flip chip cell. The first thermal test flip chip cell may include a plurality of first bumps arranged on a bottom surface of the first thermal test flip chip cell and be configured to be electrically connected to the first heater and the first sensor. The test substrate may include a first ball array arranged on a bottom surface of the test substrate in a first direction and be configured to be electrically connected to the plurality of first bumps, which are electrically connected to the first heater and the first sensor.

18 Claims, 11 Drawing Sheets

(56) References Cited

U.S. PATENT DOCUMENTS

2011/0237001 A1* 9/2011 Hasebe et al. .................. 257/48
2012/0133427 A1 5/2012 Kim et al.

FOREIGN PATENT DOCUMENTS

JP 4917902 B2 4/2012
JP 4994070 B2 8/2012

* cited by examiner

| FC11 | FC12 | FC13 | ⋯ | | | | |
|------|------|------|---|---|---|---|---|
| FC21 | FC22 | FC23 | ⋯ | | | | |
| FC31 | FC32 | FC33 | ⋯ | | | | |
| FC41 | FC42 | FC43 | ⋯ | | | | |
| FC51 | FC52 | FC53 | ⋯ | | | | |
| FC61 | FC62 | FC63 | ⋯ | | | | |
| FC71 | FC72 | FC73 | ⋯ | | | | |
| FC81 | FC82 | FC83 | ⋯ | | | | |

SEMICONDUCTOR TEST DEVICE AND METHOD FOR FABRICATING THE SAME

CROSS-REFERENCE TO RELATED APPLICATION

This application claims priority from Korean Patent Application No. 10-2013-0020636 filed on Feb. 26, 2013 in the Korean Intellectual Property Office, and all the benefits accruing therefrom under 35 U.S.C. 119, the contents of which in its entirety are herein incorporated by reference.

BACKGROUND

1. Field

Example embodiments relate to semiconductor test devices and/or methods for fabricating the same.

2. Description of the Related Art

As a semiconductor device becomes compact and highly integrated, improving the accuracy and reliability of the semiconductor device becomes an important research issue. Thus, various tests are being conducted on the semiconductor device. In particular, because the semiconductor device is sensitive to a temperature, research to figure out where and how heat is generated in the semiconductor device is being underway.

In order to measure temperature characteristics of a material used in a semiconductor chip, a thermal test die may be used. Temperatures of the semiconductor chip and resistances depending on the temperatures of the semiconductor chip may be measured using the thermal test die.

SUMMARY

Example embodiments of the present inventive concepts provide semiconductor test devices, which can effectively sense a temperature and can facilitate wiring of a test substrate.

Example embodiments of the present inventive concepts also provide methods of fabricating semiconductor test devices, which can effectively sense a temperature and can facilitate wiring of a test substrate.

These and other aspects of the present inventive concepts will be described in or be apparent from the following description of the example embodiments.

According to example embodiments of the present inventive concepts, a semiconductor test device may include a first thermal test flip chip cell including a first heater and a first sensor, the first thermal test flip chip cell including a plurality of first bumps arranged on a bottom surface thereof, the plurality of first bumps configured to electrically connect to the first heater and the first sensor, and a test substrate formed under the first thermal test flip chip cell, the test substrate including a first ball array arranged on a bottom surface thereof in a first direction, the first ball array configured to electrically connect to the plurality of first bumps.

According to example embodiments of the present inventive concepts, a method of fabricating a semiconductor test device may include providing a first thermal test flip chip cell and a test substrate, the first thermal test flip chip cell including a first heater and a first sensor, and a plurality of first bumps arranged on a bottom surface thereof, the test substrate under the first thermal test flip chip cell and including a first ball array arranged on a bottom surface of the test substrate in a first direction, connecting the first heater and the first sensor to the plurality of first bumps, and connecting the plurality of first bumps to the first ball array.

According to example embodiments of the present inventive concepts, a semiconductor test device may include at least one thermal test flip chip cell including a heater and at least one sensor, the at least one thermal test flip chip cell including a plurality of bumps arranged on a bottom surface thereof, the plurality of bumps configured to electrically connect to the heater and the at least one sensor, and a test substrate under the at least one thermal test flip chip cell, the test substrate including at least one ball array arranged on a bottom surface thereof in a first direction, the first ball array configured to electrically connect to the plurality of bumps.

BRIEF DESCRIPTION OF THE DRAWINGS

The above and other features and advantages of the present inventive concepts will become more apparent by describing in detail example embodiments thereof with reference to the attached drawings in which.

DETAILED DESCRIPTION

Figures 1, 2:
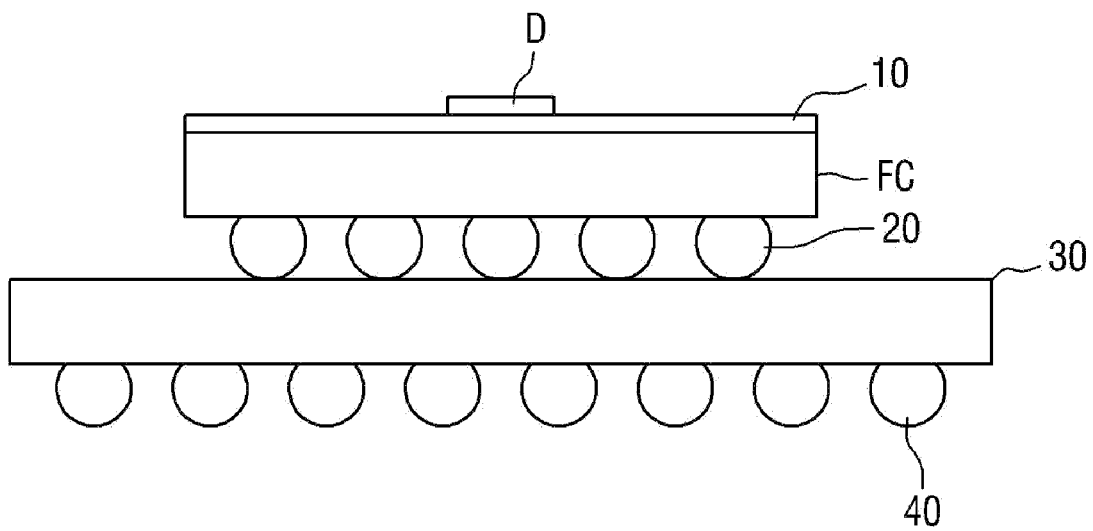
FIG. 1 is a side view of a semiconductor test device according to example embodiments of the present inventive concepts.
FIG. 2 illustrates a portion of the thermal test flip chip cell shown in FIG. 1.

Example embodiments will now be described more fully hereinafter with reference to the accompanying drawings, in which some example embodiments are shown. Example embodiments may, however, be embodied in different forms and should not be construed as limited to the embodiments set forth herein. Rather, these embodiments are provided so that this disclosure will be thorough and complete, and will fully convey the scope of example embodiments to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing example embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Example embodiments will be described with reference to perspective views, cross-sectional views, and/or plan views, in which the example embodiments of are shown. Thus, the profile of example views may be modified according to manufacturing techniques and/or allowances. That is, the example embodiments are not intended to limit the scope of example embodiments but cover all changes and modifications that can be caused due to a change in manufacturing process. Thus, regions shown in the drawings are illustrated in schematic form and the shapes of the regions are presented simply by way of illustration and not as a limitation.

Unless defined otherwise, all technical and scientific terms used herein have the same meaning as commonly understood by one of ordinary skill in the art to which example embodiments belong. It is noted that the use of any and all examples, or example terms provided herein is intended merely to better illuminate the example embodiments and is not a limitation on the scope of example embodiments unless otherwise specified. Further, unless defined otherwise, those defined in commonly-used dictionaries should be interpreted as having a meaning that is consistent with their meaning in the context of the relevant art and will not be interpreted in an idealized or overly formal sense.

Hereinafter, a semiconductor test device according to example embodiments of the present inventive concepts will be described with reference to FIG. 1.

FIG. 1 is a side view of a semiconductor test device according to example embodiments of the present inventive concepts.

Referring to FIG. 1, the semiconductor test device according to the example embodiments of the present inventive concepts may include a test substrate 30 and a thermal test flip chip cell FC formed on the test substrate 30.

The thermal test flip chip cell FC may be fabricated to test temperature characteristics of a flip chip. Therefore, the thermal test flip chip cell FC may be formed using the same material as the flip chip to be tested.

A heater 10 and a sensor D may be formed on the thermal test flip chip cell FC. The heater 10 may be configured to apply heat to the thermal test flip chip cell FC. In order to evenly apply heat to the thermal test flip chip cell FC, the heater 10 may cover a substantial portion of a top surface of the thermal test flip chip cell FC. For example, if the heater 10 covers at least 85% of the top surface of the thermal test flip chip cell FC, the heat can be evenly applied to substantially the entire surface of the thermal test flip chip cell FC.

In order to evenly apply heat to the thermal test flip chip cell FC, the heater 10 may include, for example, a resistor. The resistance may generate heat while consuming power, but example embodiments are not limited thereto. The heater 10 may apply heat to the thermal test flip chip cell FC using an element other than the resistor.

The sensor D may be formed on the thermal test flip chip cell FC and may measure the temperature of the thermal test flip chip cell FC. The sensor D may include, for example, a diode, but example embodiments are not limited thereto. The position of the thermal test flip chip cell FC, on which the sensor D may be disposed, and the number of sensors disposed thereon, will later be described.

A plurality of bumps 20 may be arranged on the bottom surface of the thermal test flip chip cell FC. The plurality of bumps 20 may be connected to the heater 10 and the sensor D of the thermal test flip chip cell FC, which are electrically connected to the test substrate 30 through the plurality of bumps 20.

The test substrate 30 may be disposed under the thermal test flip chip cell FC and may be electrically connected to the thermal test flip chip cell FC. Temperature characteristics of the thermal test flip chip cell FC may be measured through the test substrate 30. The test substrate 30 may include a rigid substrate made of one or more semiconductor materials selected from the group consisting of Si, Ge, SiGe, GaP, GaAs, SiC, SiGeC, InAs and InP, a silicon on insulator (SOI) substrate, a quartz substrate or a glass substrate for display, or a flexible plastic substrate made of polyimide, polyethyleneterephthalate (PET), polyethylene naphthalate (PEN), polymethylmethacrylate (PMMA), polycarbonate (PC), or polyethersulfone (PES).

A plurality of balls 40 may be formed on a bottom surface of the test substrate 30, and may be connected to the plurality of bumps 20 connected to the heater 10 and the sensor D. The plurality of bumps 20 and the plurality of balls 40 may be connected to each other by internal wiring in the test substrate 30 (now shown).

The test substrate 30 formed of a single layer is illustrated in FIG. 1 as an example, but example embodiments are not limited thereto. The test substrate 30 may include multiple layers.

The thermal test flip chip cell of the semiconductor test device according to example embodiments of the present inventive concepts will now be described with reference to FIGS. 2 to 7.

Figure 3:
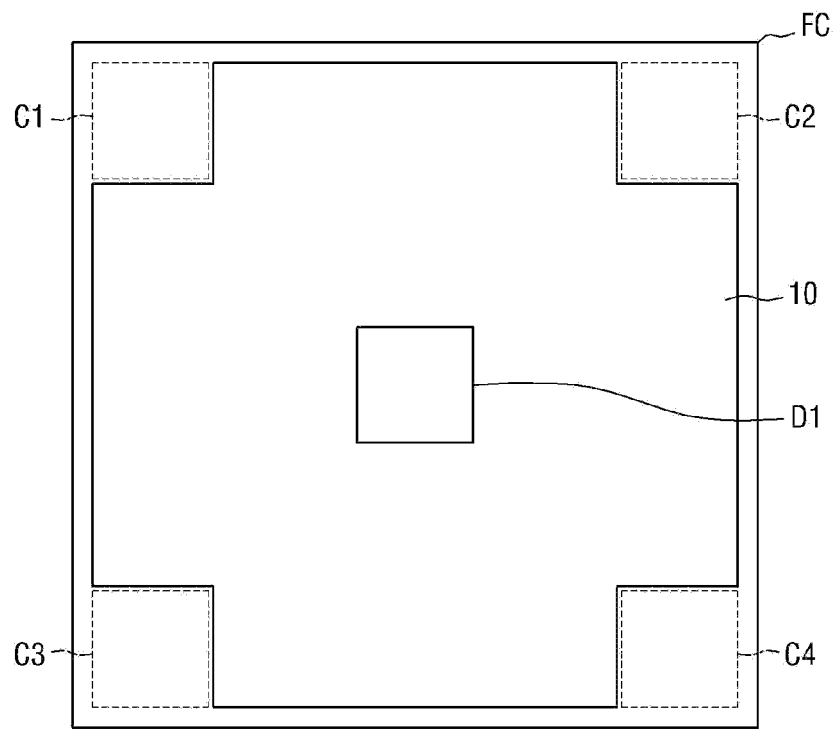
FIGS. 3 and 4 are plan views of the thermal test flip chip cell shown in FIG. 1.
Figure 4:
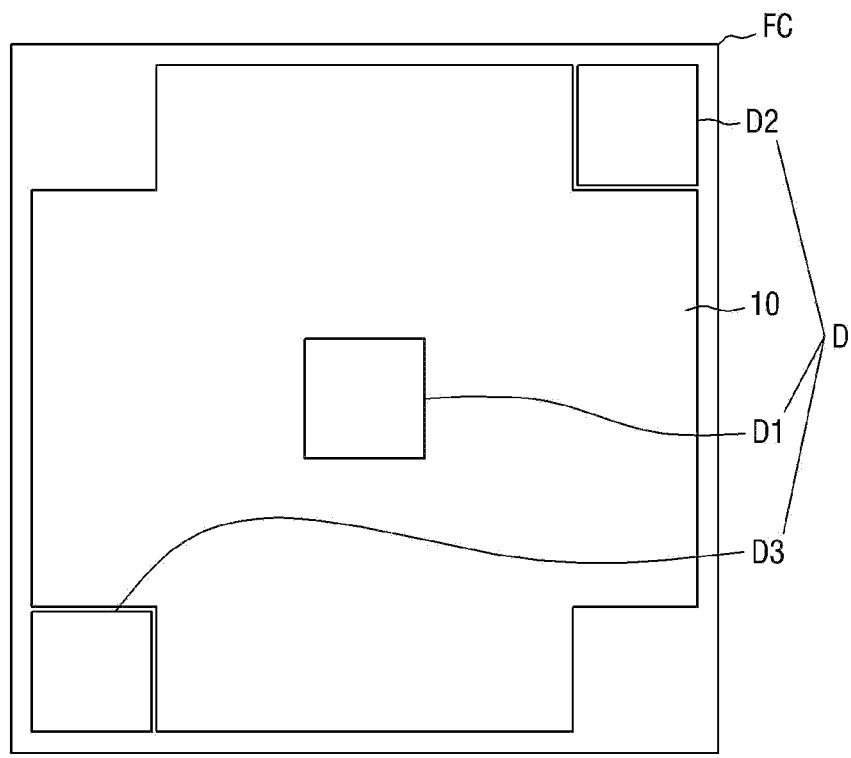

FIG. 2 illustrates a portion of the thermal test flip chip cell shown in FIG. 1, FIGS. 3 and 4 are plan views of the thermal test flip chip cell shown in FIG. 1, and FIGS. 5 to 7 are bottom views of the thermal test flip chip cell shown in FIG. 1.

Referring to FIG. 2, the thermal test flip chip cell FC may be selected from a thermal test flip chip cell array. The thermal test flip chip cell array may include a plurality of thermal test flip chip cells FC11 to FC83. The thermal test flip chip cell array may be formed in a wafer and may be separated into the plurality of thermal test flip chip cells FC11 to FC83 by sawing. Some thermal test flip chip cells FC may be selected to form a block (BL of FIG. 10), which will later be described.

Referring to FIG. 3, in order to apply heat to the thermal test flip chip cells FC and to measure temperature characteristics of the thermal test flip chip cells FC, at least one sensor D and at least one heater 10 may be provided. The sensor D may be disposed at a central portion of a top surface of each of the thermal test flip chip cells FC, and the heater 10 may cover the top surface of each of the thermal test flip chip cells FC, where the sensor D is not disposed.

FIG. 3 illustrates the heater 10 having a rectangle shape with first to fourth corners C1 to C4 removed, but example embodiments are not limited thereto. The heater 10 may be arranged in any shape as long as it can cover a desired (or alternatively, predetermined) portion of the top surface of the thermal test flip chip cell FC, for example, 85% or greater.

Referring to FIGS. 3 and 4, the sensor D may include a plurality of sensors. For example, the sensor D may include a first sub sensor D1 and second sub sensors D2 and D3. The first sub sensor D1 may be disposed at the central portion of the thermal test flip chip cell FC, and the second sub sensors D2 and D3 may be disposed at two or more locations of the first to fourth corners C1 to C4 of the thermal test flip chip cell FC. The first to fourth corners C1 to C4 may be four corner portions of the thermal test flip chip cell FC, and may correspond to exposed portions of the top surface of the thermal test flip chip cell FC by the heater 10. The second sub sensors D2 and D3 may be disposed at two or more locations of the first to fourth corners C1 to C4. FIG. 4 illustrates two second sub sensors D2 and D3 disposed on the top surface of the thermal test flip chip cell FC and at the second corner C2 and the third corner C3, but example embodiments are not limited thereto. For example, the second sub sensors D2 and D3 may also be disposed at the first second corner C1 and the third corner C3. Further, third sub sensors may be provided.

When the sensor D includes three or more sensors, including, for example, the first sub sensor D1 and the second sub sensors D2 and D3, the temperatures can be effectively measured, as will described later.

Figure 5:
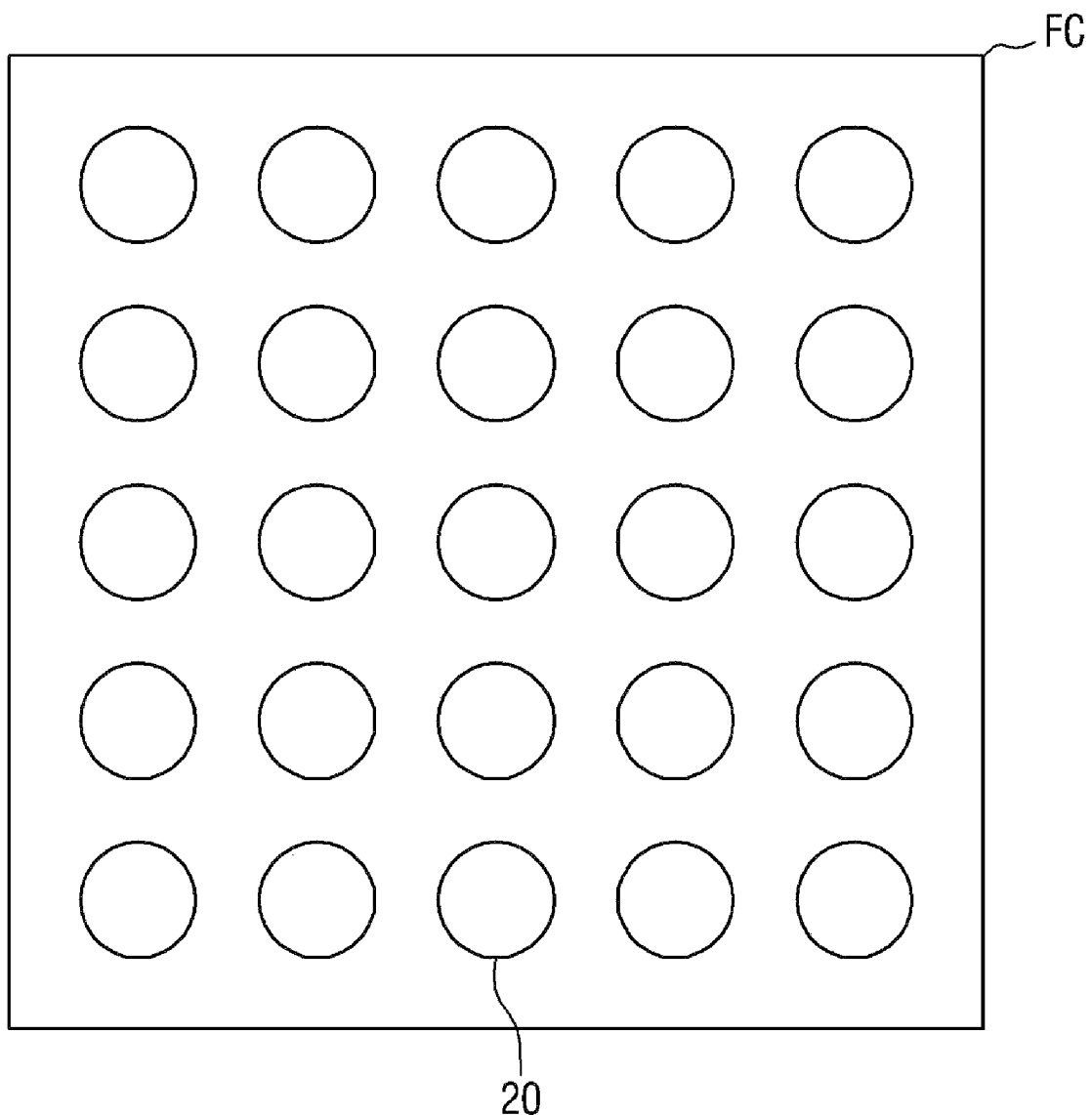
FIGS. 5 to 7 are bottom views of the thermal test flip chip cell shown in FIG. 1.

Referring to FIG. 5, a plurality of bumps 20 may be arranged on a bottom surface of the thermal test flip chip cell FC. FIG. 5 illustrates 25 bumps arranged in a 5×5 array, but example embodiments are not limited thereto. The thermal test flip chip cell FC may include various numbers of bumps 20.

Figure 6:
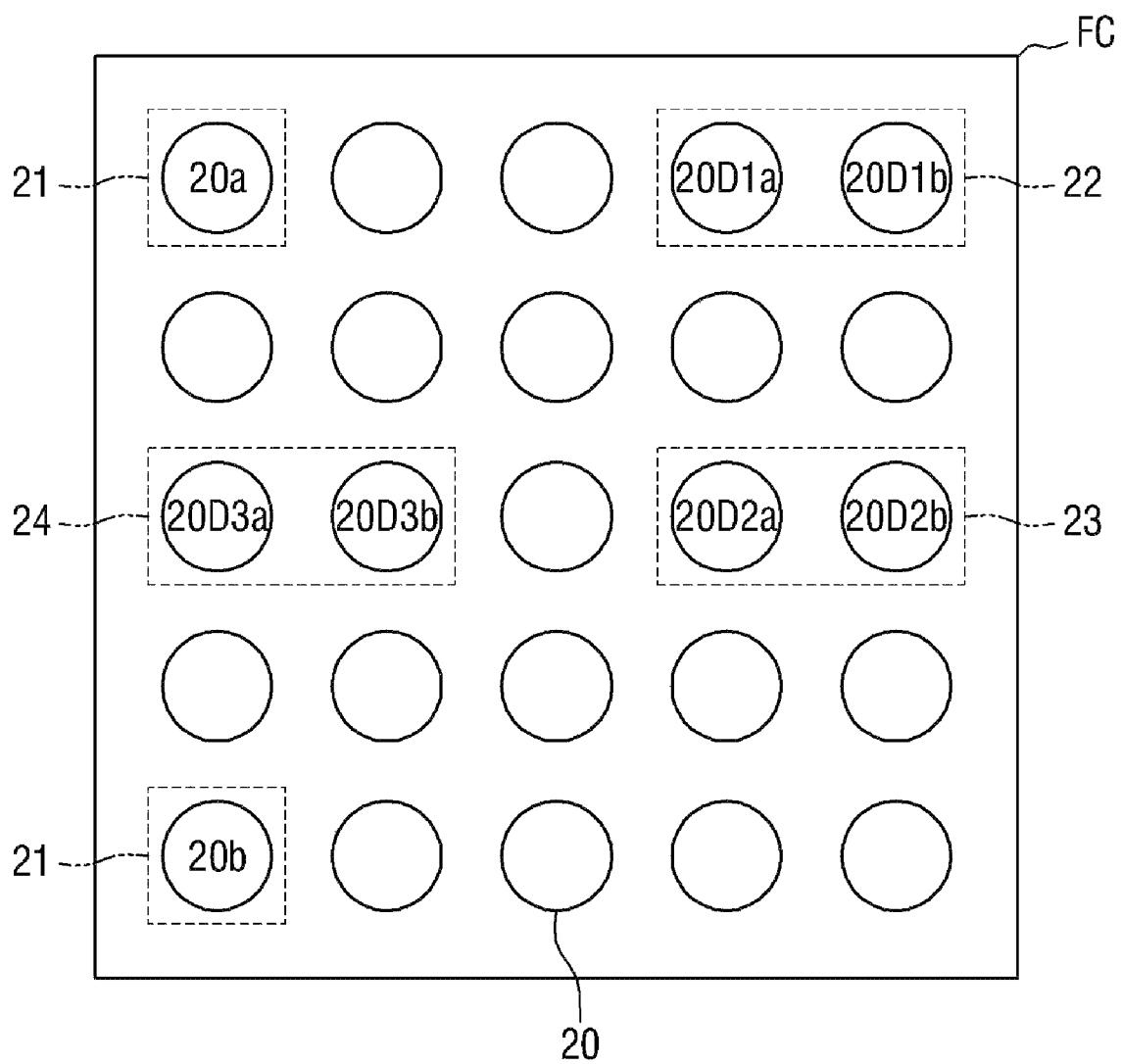

Because temperature characteristics of the thermal test flip chip cell FC may be measured by using the heater 10 and the sensor D, the heater 10 and the sensor D may be connected to a power supply device supplying power and a data collecting device measuring a change in the temperature. The plurality of bumps 20 may connect the heater 10 and the sensor D to the power supply device and the data collecting device. To connect both of the heater 10 and the sensor D to two devices (i.e., the power supply device and the data collecting device), each of the heater 10 and the sensor D may be connected to at least two bumps 20. For example, the heater 10 may be electrically connected to at least two bumps 20 and the sensor D may also be electrically connected to at least two bumps 20. One of the respective two bumps may be connected to the power supply device and the other of the respective two bumps may be connected to the data collecting device. FIG. 6 shows that the heater 10 and the sensor D of the thermal test flip cell FC shown in FIG. 3 are connected to the plurality of bumps 20. The heater 10 may be connected to bumps 20a and 20b of a first region 21, the first sub sensor D1 may be connected to bumps 20D1a and 20D1b of a second region 22, and each of second sub sensors D2 and D3 may be connected to bumps 20D2a and 20D2b of a third region 23 and bumps 20D3a and 20D3b of a fourth bump 24, but example embodiments are not limited thereto. If each of the heater 10 and sensor D is connected to respective two bumps 20, positions of the bumps 20 connected to the heater 10 and the sensor D may vary in various manners.

In order to connect the heater 10 and the sensor D to the power supply device and the data collecting device, the heater 10 and the sensor D may be connected to more than two bumps 20. For example, referring to FIG. 7, each of the heaters 10 and the sensor D may be electrically connected to four bumps. The heater 10 may be connected to the bumps 20a to 20d of the first region 21, the first sub sensor D1 may be connected to the bumps 20D1a to 20D1d of the second region 22, and each of second sub sensors D2 and D3 may be connected to the bumps 20D2a to 20D2d of the third region 23 and the bumps 20D3a to 20D3d of the fourth bump 24, but example embodiments are not limited thereto. If each of the heater 10 and sensor D is connected to four bumps 20, positions of the bumps 20 connected to the heater 10 and the sensor D may vary in various manners. In a case where the heater 10 and the sensor D are connected to four bumps 20, two of the four bumps 20 may be connected to the power supply and the other two may be connected to the data collecting device.

Figure 7:
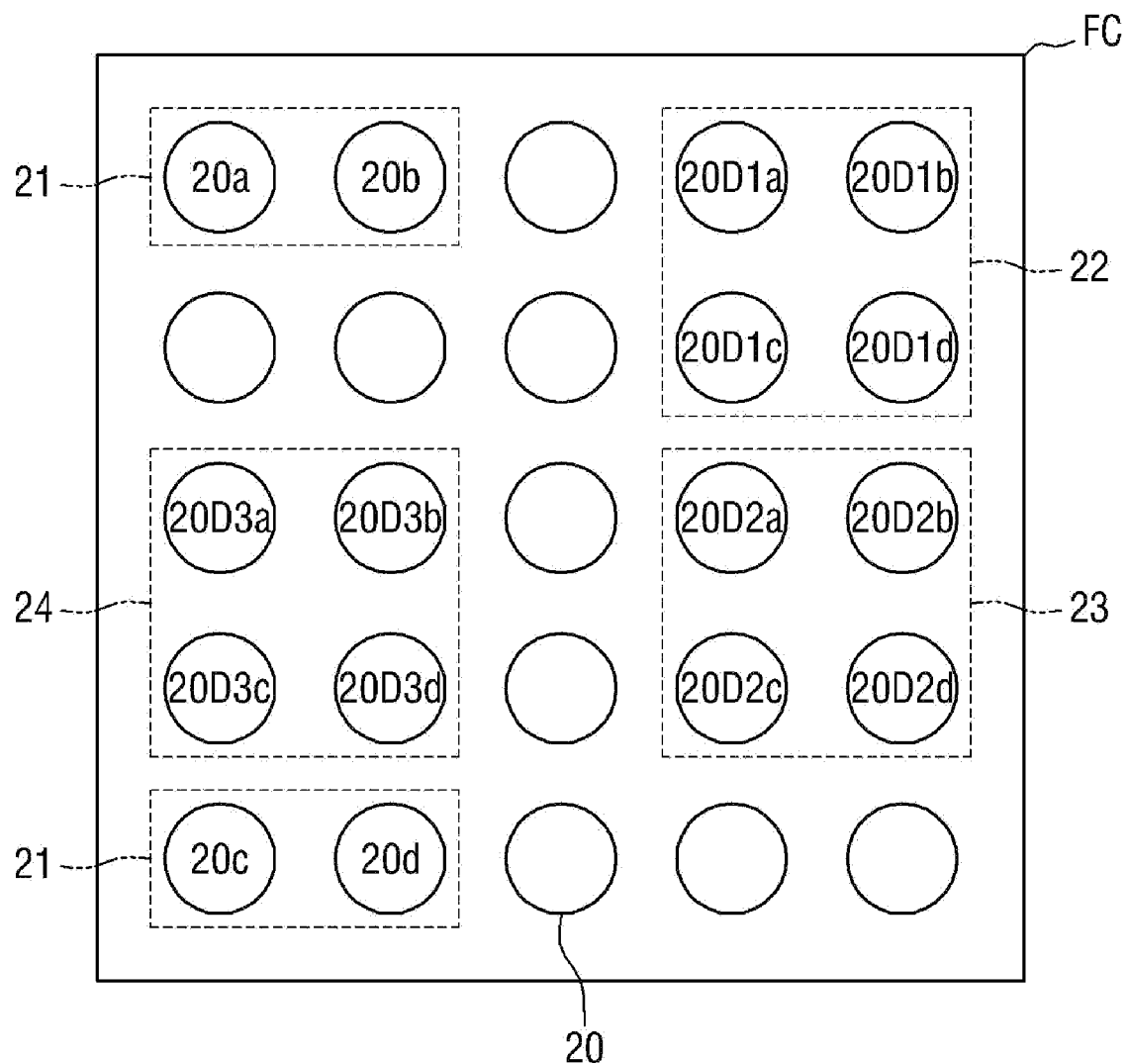

As many bumps 20 as the heater 10 and the sensor D can be connected to the power supply device and the data collecting device should be provided. Thus, referring to FIG. 6, because each of the heater 10 and the sensor D is connected to two bumps 20, eight or more bumps 20 may be provided on the bottom surface of the thermal test flip chip cell FC. Referring to FIG. 7, because each of the heater 10 and the sensor D requires four bumps 20, 16 or more bumps 20 may be provided on the bottom surface of the thermal test flip chip cell FC.

Hereinafter, a ball array disposed on the bottom surface of the test substrate and a connection relationship between the ball array and a plurality of bumps will be described.

Figure 8:
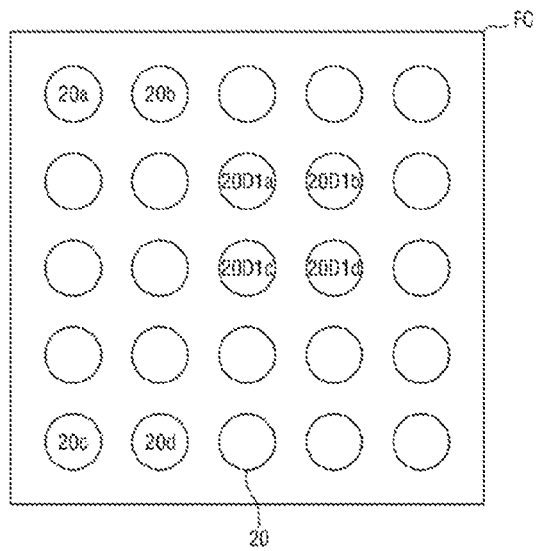
FIG. 8 is a bottom surface of a thermal test flip chip cell according to example embodiments of the present inventive concepts.
Figure 9:
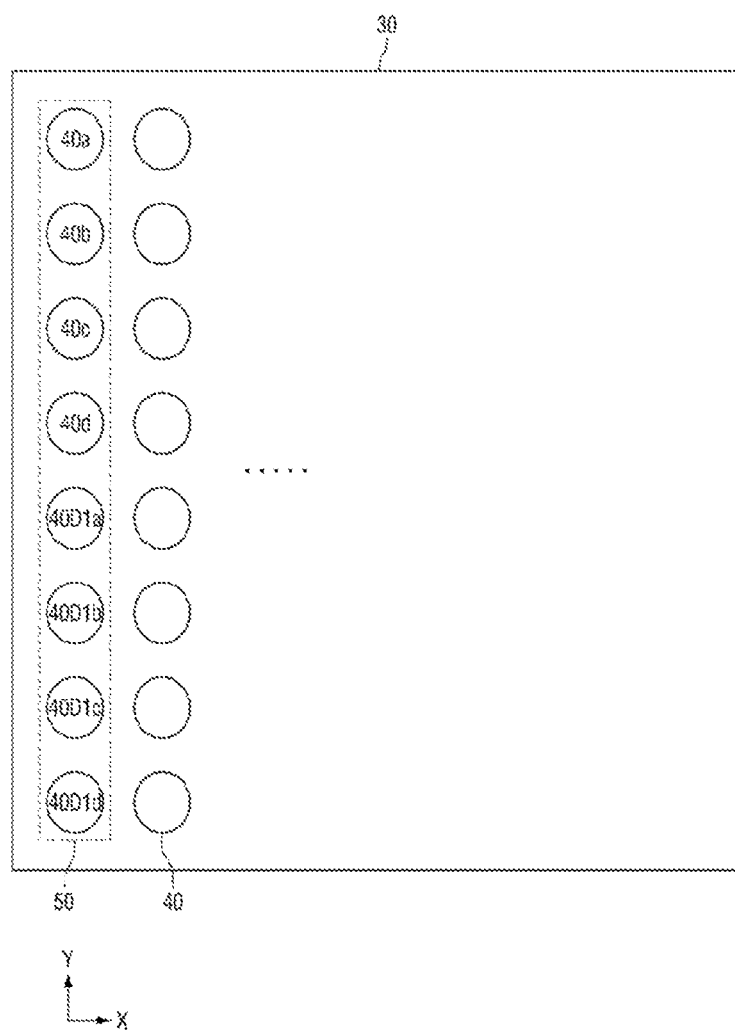
FIG. 9 is a bottom surface of a test substrate according to example embodiments of the present inventive concepts.

FIG. 8 is a bottom surface of a thermal test flip chip cell according to example embodiments of the present inventive concepts, and FIG. 9 is a bottom surface of a test substrate according to example embodiments of the present inventive concepts.

For brevity, it is assumed that the thermal test flip chip cell FC includes one heater 10 and one sensor D, the heater 10 is electrically connected to four bumps 20a to 20d and the sensor D is electrically connected to four bumps 20D1a to 20D1d.

To connect the heater 10 and the sensor D to the power supply device and the data collecting device, the heater 10 and the sensor D may be connected to the plurality of bumps 20, which are connected to the plurality of balls 40 disposed on the bottom surface of the test substrate 30.

The plurality of balls 40 and the plurality of bumps 20 may be matched to each other in one-to-one correspondence. For example, one bump 20 may be electrically connected to one ball 40. If all of the plurality of bumps 20 disposed on the bottom surface of the thermal test flip chip cell FC are connected to the plurality of balls 40 in one-to-one correspondence, because only some of the plurality of bumps 20 may be connected to the heater 10 and the sensor D, the bumps 20 that are not connected to the heater 10 and the sensor D may be unnecessarily connected to the balls 40. In this case, the number of balls disposed on the bottom surface of the test substrate 30 may be larger than necessary, thereby making the test substrate 30 bulky. For example, all of the balls 40 may not be accommodated on the bottom surface of the test substrate 30. The plurality of balls 40 corresponding to one thermal test flip chip cell FC may be electrically connected to the plurality of bumps 20 electrically connected to the heater 10 and the sensor D. FIG. 8 illustrates that only eight bumps 20 among the plurality of bumps 20 are connected to the heater 10 and the sensor D, and thus the number of balls 40 connected to the thermal test flip chip cell FC is 8. Eight bumps 20a to 20d and 20D1a to 20D1d may be matched to eight balls 40a to 40d and 40D1a to 40D1d in one-to-one correspondence.

The plurality of balls 40 corresponding to one thermal test flip chip cell FC may form a ball array 50. As shown in FIG. 9, the ball array 50 may be arranged in a first direction (e.g., in the Y-axis direction). If the plurality of balls 40 is arranged in a line, the plurality of balls 40 may be easily electrically connected to each other, which will later be described.

Next, a semiconductor test device according to example embodiments of the present inventive concepts will be described with reference to FIGS. 2 and 10 to 13.

Figure 10:
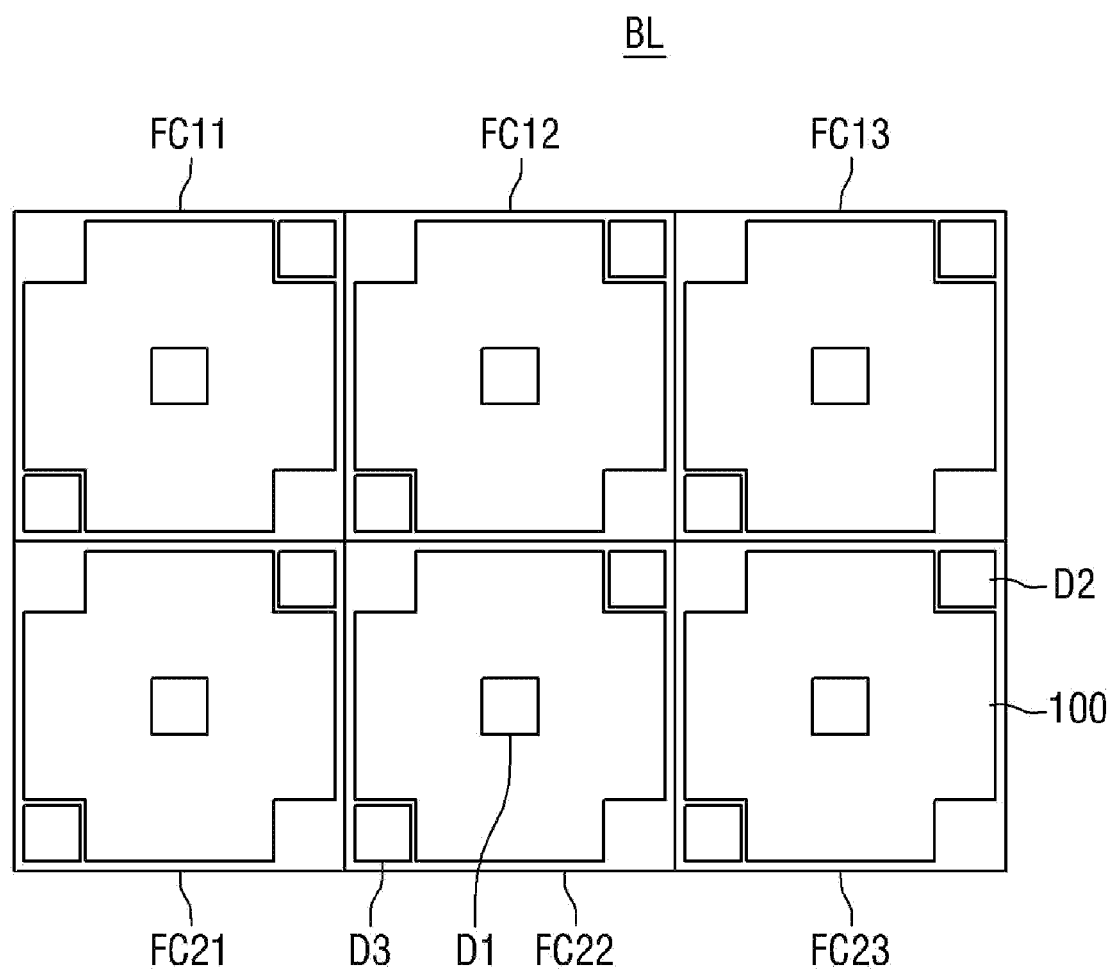
FIG. 10 is a plan view of a flip chip cell according to example embodiments of the present inventive concepts.
Figure 11:
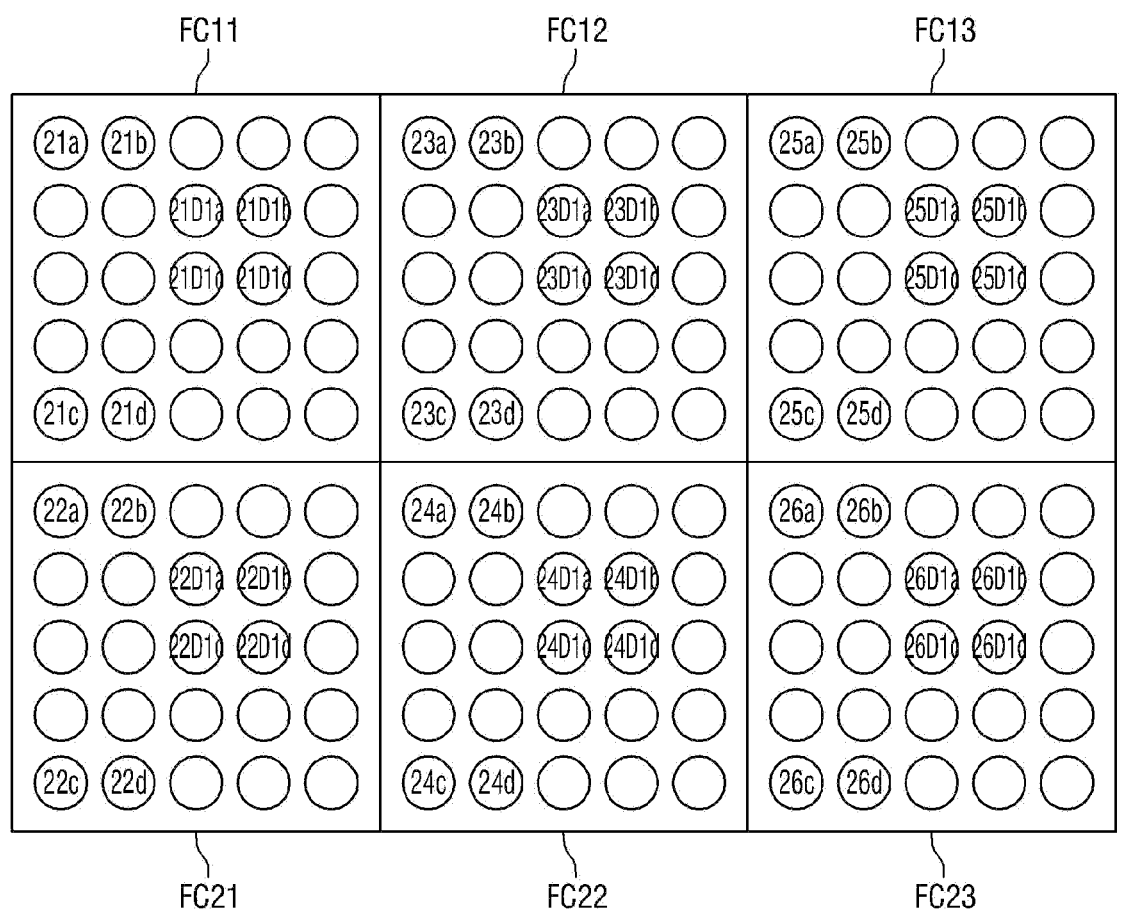
FIG. 11 is a bottom surface of the flip chip cell shown in FIG. 10.
Figure 12:
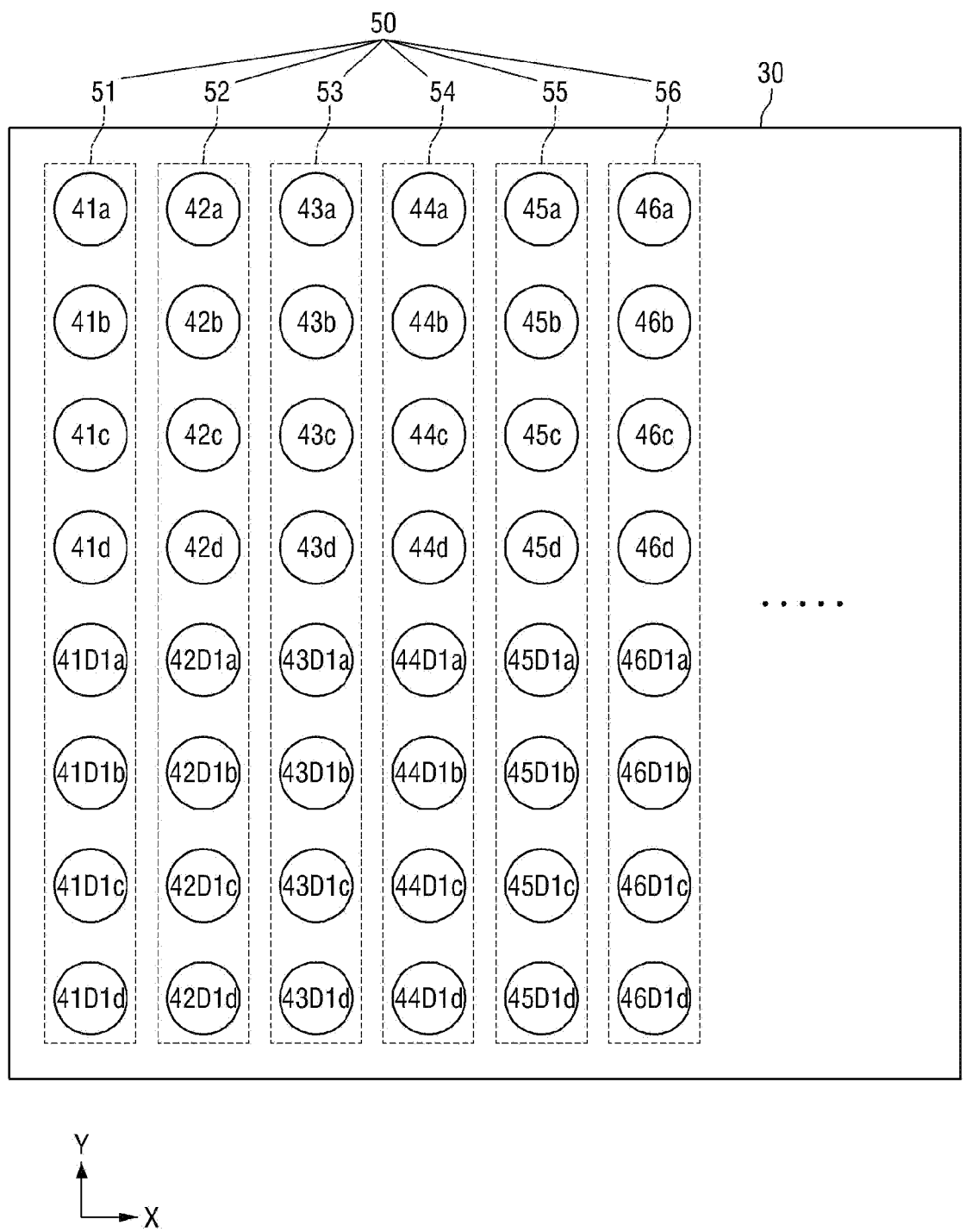
FIGS. 12 and 13 are bottom surfaces of a test substrate according to example embodiments of the present inventive concepts.
Figure 13:
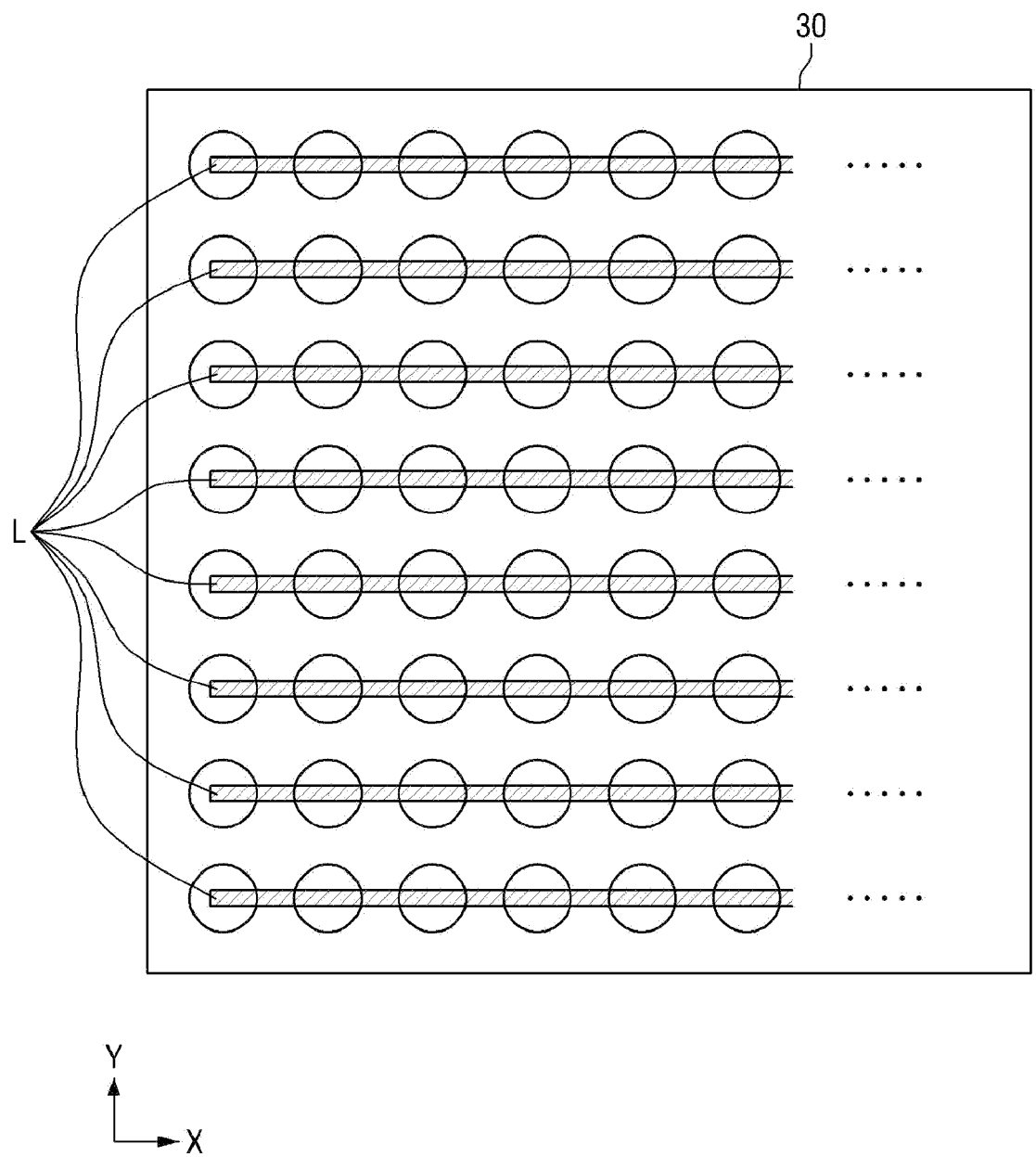

FIG. 10 is a plan view of a flip chip cell according to example embodiments of the present inventive concepts, FIG. 11 is a bottom surface of the flip chip cell shown in FIG. 10, and FIGS. 12 and 13 are bottom surfaces of a test substrate according to example embodiments of the present inventive concepts.

The semiconductor test device according to example embodiments of the present inventive concepts may include a plurality of thermal test flip chip cells FC. A flip chip actually used in a product may be larger than a thermal test flip chip cell FC and may have various sizes. Because the thermal test flip chip cell FC is used to measure temperature characteristics of the actually used flip chip, the plurality of thermal test flip chip cells FC may be formed to have the same size as the actually used flip chip. The plurality of thermal test flip chip cells FC may form a block BL.

FIG. 10 illustrates that six thermal test flip chip cells FC are arranged in a 2×3 array. The six thermal test flip chip cells FC may form one block BL. For example, one block BL may include a first thermal test flip chip cell FC11, a second thermal test flip chip cell FC21, a third thermal test flip chip cell FC12, a fourth thermal test flip chip cell FC22, a fifth thermal test flip chip cell FC13 and a sixth thermal test flip chip cell FC23. The heater 10 and the sensor D may be formed on each of the thermal test flip chip cells FC11 to FC23, and the plurality of bumps 20 may be formed on the bottom surface of each of the thermal test flip chip cells FC11 to FC23. In FIG. 10, 3 sensors D may be formed on a top surface of each of the thermal test flip chip cells FC, but example embodiments are not limited thereto.

As shown in FIG. 10, three sensors may be formed on the top surface of each of the thermal test flip chip cells FC. For example, second sub sensors D2 and D3 may be disposed at opposite side with respect to a first sub sensor D1, and the first and second sub sensors D may be arranged in a straight line, thereby effectively measuring temperatures of the block BL. The second sub sensors D2 and D3 may be additionally provided to measure temperatures at various locations of the block BL, compared to a case of providing only one sensor D. For example, the temperatures can be measured at locations close to the center of the block BL. In general, most elements and circuits of a flip chip are positioned at a central portion of the flip chip. Therefore, measuring temperatures at various locations close to the center of the block BL may be helpful to approximate temperature characteristics of the actually used flip chip. In FIG. 10, the center of the block BL may be a contact portion between the third thermal test flip chip cell FC12 and the fourth thermal test flip chip cell FC22. Thus, first sub sensors D1 of the third and fourth thermal test flip chip cells FC12 and FC22, second sub sensors D2 and D3 of the third thermal test flip chip cell FC12, and second sub sensors D2 and D3 of the fourth thermal test flip chip cell FC, can measure the temperatures at various locations around the center of the block BL.

If the block BL has a 2×2 array, e.g., if the block BL includes only four thermal test flip chip cells including first to fourth thermal test flip chip cells FC11, FC21, FC12 and FC22, the center of the block BL may correspond to a vertex making contact with all of the first to fourth thermal test flip chip cells FC11, FC21, FC12 and FC22. Thus, the second sub sensor D2 of the second thermal test flip chip cell FC21 and the second sub sensor D3 of the third thermal test flip chip cell FC12, which are positioned to be closer to the center of the block BL than the first sub sensor D1, can measure the temperatures of various locations around the center of the 2×2 block.

Consequently, if the block BL includes thermal test flip chip cells FC in an N×N array, where N is a natural number, the temperature of the center of the block BL can be measured through the second sub sensors D2 and D3. If the block BL includes thermal test flip chip cells FC in an N×M array, where M is a natural number different from N, the temperatures of the center of the block BL can be determined by measuring temperatures at various locations in the vicinity of the center of the block BL, compared to a case where the thermal test flip chip cell FC includes one sensor D.

In order to obtain various data concerning temperature characteristics, one thermal test flip chip cell FC may include many sensors D. As the number of sensors D increases, the number of bumps 20 disposed on the bottom surface of the thermal test flip chip cell FC may increase. Because wirings for connecting the bumps 20 to the balls 40 and connecting the bumps 20 to the heater 10 and the sensor D become complex, the number of sensors D included in one thermal test flip chip cell FC may not be indefinitely increased.

Hereinafter, a connection relationship between a ball array disposed on the bottom surface of a test substrate and a plurality of bumps will be described with reference to FIGS. 11 to 13. For brevity, it is assumed that one thermal test flip chip cell FC includes one heater 10 and one sensor D, and each of the heater 10 and the sensor D is electrically connected to four bumps.

Referring to FIG. 11, one block (BL of FIG. 10) may include six thermal test flip chip cells FC. Each of the thermal test flip chip cells FC may include a heater 10 and a sensor D, which are electrically connected to a plurality of bumps 20 disposed on a bottom surface of each of the thermal test flip chip cells FC. For example, the heater 10 of a first thermal test flip chip cell FC may be electrically connected to four bumps 21a to 21d, and the sensor D is electrically connected to four bumps 21D1a to 21D1d. These connection arrangements also apply to second to sixth thermal test flip chip cells FC21, FC12, FC22, FC13 and FC23.

The thermal test flip chip cells FC11 to FC23 may be electrically connected to ball arrays 50 (shown in FIG. 12) disposed on a bottom surface of the test substrate 30. Because each of the thermal test flip chip cells FC uses eight bumps 20 to connect the heater 10 and the sensor D to a power supply device and a data collecting device, the ball arrays 50 may include eight balls 40. Each of the ball arrays 50 may be arranged in a first direction (e.g., in the Y-axis direction). The first thermal test flip chip cell FC11 may be electrically connected to a first ball array 51, the second thermal test flip chip cell FC21 may be electrically connected to a second ball array 52, the third thermal test flip chip cell FC21 may be electrically connected to a third ball array 53, the fourth thermal test flip chip cell FC22 may be electrically connected to a fourth ball array 54, the fifth thermal test flip chip cell FC13 may be electrically connected to a fifth ball array 55, and the sixth thermal test flip chip cell FC23 may be electrically connected to a sixth ball array 56. For example, in the first thermal test flip chip cell FC11, eight bumps 21a to 21d and 21D1a to 21D1d connected to the heater 10 and the sensor D may be connected to eight balls 41a to 41d and 41D1a to 41D1d included in the first ball array 51 in one-to-one correspondence. In the second thermal test flip chip cell FC21 disposed at one side of the first thermal test flip chip cell FC11, eight bumps 22a to 22d and 22D1a to 22D 1d connected to the heater 10 and the sensor D may be connected to eight balls 42a to 42d and 42D1a to 42D1d included in the second ball array 52 in one-to-one correspondence. In the same manner, bumps 20 included in the third to sixth thermal test flip chip cells FC12, FC22, FC13 and FC23 may be connected to the third to sixth ball arrays 53 to 56, respectively. The first to sixth ball arrays 51 to 56 may be arranged in a second direction to be parallel with each other.

The balls 40 included in each of the ball arrays 50 may be connected to the bumps 20, respectively, in the same order. For example, the first to fourth balls 41a to 41d of the first ball array 51, which are included eight balls 40 arranged in the first direction, may be electrically connected to the heater 10 of the first thermal test flip chip cell FC11, and the fifth to eighth balls 41D1a to 41D1d may be electrically connected to the sensor D of the first thermal test flip chip cell FC11. The first to fourth balls 42a to 42d of the second ball array 52 may be electrically connected to the heater 10 of the second thermal test flip chip cell FC21, and the fifth to eighth balls 42D1a to 42D1d may be electrically connected to the sensor D of the second thermal test flip chip cell FC21. These connection arrangements also apply to the third to sixth ball arrays 53 to 56.

If the balls 40 included in each of the ball arrays 50 are connected to the heater 10 and the sensor D of the thermal test flip chip cell FC, respectively, in the same order, wirings for connecting the balls 40 can be easily formed. The heater 10 and the sensor D of the first thermal test flip chip cell FC11 may be connected to the power supply device and the data collecting device through the balls 40 of the test substrate 30. For example, the power supply device and the data collecting device may be connected to each block BL including a plurality of thermal test flip chip cells FC because measuring temperature characteristics of the entire block BL, rather than a portion of the block BL, may be useful in fabricating an actual flip chip having the same size as the block BL. For example, if the balls 40 are randomly arranged on the bottom surface of the test substrate 30, it may be difficult to form wirings for connecting the bumps 20 to the balls 40 and connecting the balls 40 to the power supply device and the data collecting device. For example, as the number of heaters 10 and/or sensors D included in one thermal test flip chip cell FC increase, and/or the number of thermal test flip chip cells FC included in a block BL increases, forming the wirings becomes complicated.

According to example embodiments of the present inventive concepts, the plurality of balls 40 connected to one thermal test flip chip cell FC may be arranged in the first direction (e.g., in the Y-axis direction), forming a plurality of ball arrays 50, and the plurality of ball arrays 50 connected to the plurality of thermal test flip chip cells FC included in the block BL may be arranged in the second direction to be parallel with each other, thereby easily forming the wirings.

Referring to FIG. 13, in order to electrically connect the balls 40 to the power supply device and the data collecting device, the balls 40 may be electrically connected to each other in a second direction (e.g., in the X-axis direction) because, for example, the balls 40 corresponding to the heater 10 and the sensor D may be at the same position in each of the ball arrays 50. Therefore, among the plurality of balls 40 disposed on the bottom surface of the test substrate 30, the balls 40 arranged in the second direction may be electrically connected to each other, thereby easily forming the wirings. Lines L connecting the plurality of balls 40 in the second direction may extend in the second direction. FIG. 13 illustrates the lines L directly connecting the balls 40 as an example, but example embodiments are not limited thereto. The lines L may be formed within the test substrate 30 to extend in the second direction.

For example, the first direction and the second direction may be different from each other. In particular, the first direction and the second direction may be perpendicular to each other, but example embodiments are not limited thereto. For example, the ball arrays 50 may be arranged in the second direction, and In this case, the respective ball arrays 50 may be arranged in the first direction to be parallel to each other, and the lines L may also be formed in the first direction.

Hereinafter, a method for fabricating a semiconductor test device according to example embodiments of the present inventive concepts will be described with reference to FIGS. 1, 3, 8 to 12 and 14. The same and/or similar details as those described above will be omitted.

Figure 14:
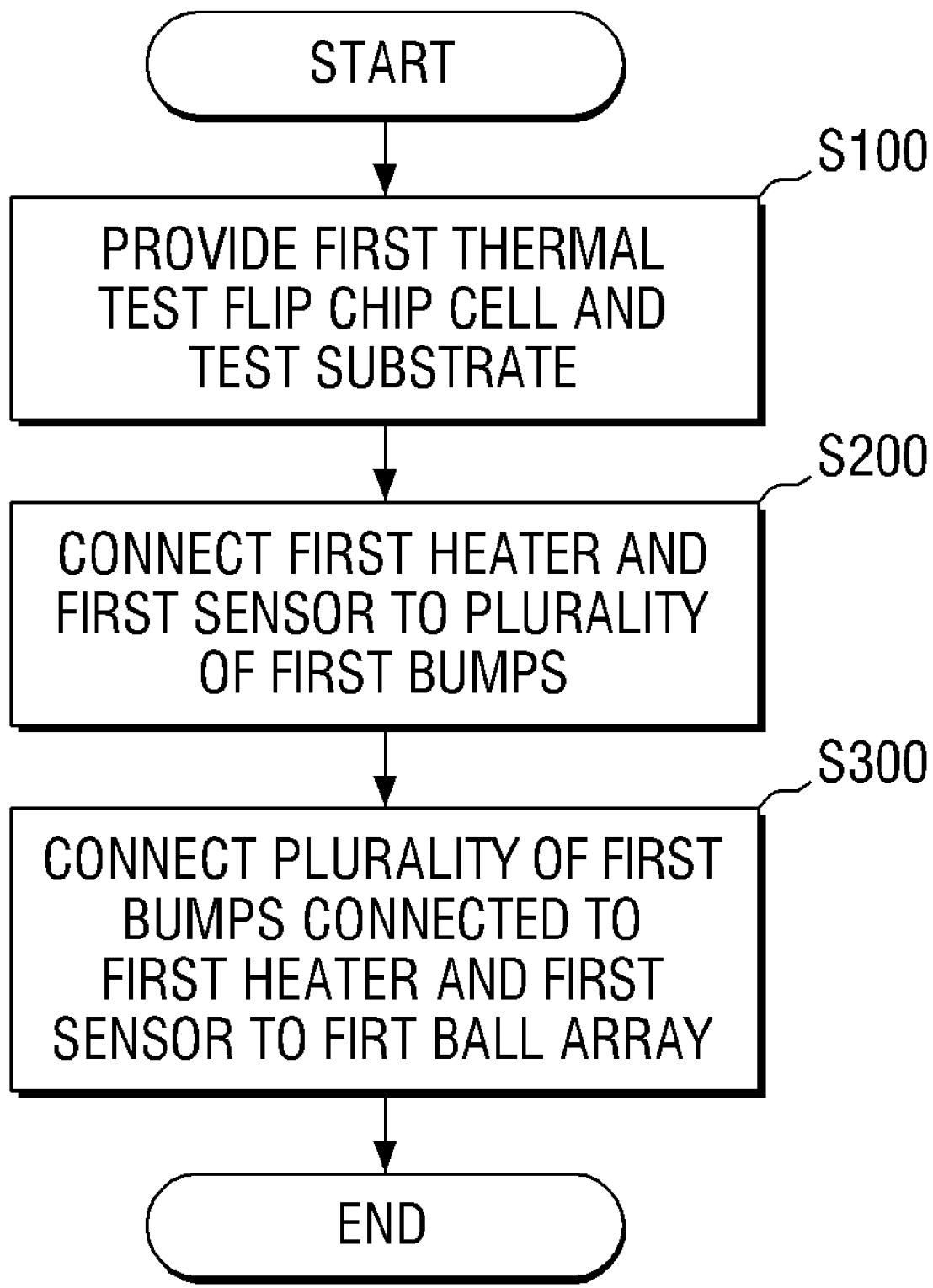
FIG. 14 is a flowchart illustrating a method for fabricating a semiconductor test device according to example embodiments of the present inventive concepts.

FIG. 14 is a flowchart illustrating a method for fabricating a semiconductor test device according to example embodiments of the present inventive concepts.

Referring to FIG. 14, a first thermal test flip chip cell and a test substrate may be provided (S100).

Referring to FIGS. 1, 3, 8 and 9, the first thermal test flip chip cell FC may include a first heater 10 and a first sensor D, and a plurality of first bumps 20 may be disposed on a bottom surface of the first thermal test flip chip FC. A test substrate 30 may be provided under the first thermal test flip chip, and the test substrate 30 may include a plurality of balls 40, which forms a plurality of first ball arrays 50 disposed on a bottom surface of the test substrate 30. The first ball array 50 may be arranged in the first direction (e.g., in the Y-axis direction).

Referring to FIG. 10, the semiconductor test device may include a plurality of thermal test flip chip cells FC. For example, the semiconductor test device may include a first thermal test flip chip FC11 and a second thermal test flip chip FC21 disposed on the test substrate 30. The second thermal test flip chip FC21 may be disposed at one side of the first thermal test flip chip FC11. The second thermal test flip chip FC21 may include a second heater 10 and a second sensor D and a plurality of second bumps 20 disposed on a bottom surface of the second thermal test flip chip cell FC.

Next, referring again to FIG. 14, a heater and a sensor may be connected to the plurality of bumps 20 (S200). Referring to FIGS. 6 to 8, the first heater 10 and the first sensor D may be electrically connected to some of the plurality of first bumps 20.

If the semiconductor test device further includes the second thermal test flip chip FC21, as shown in FIG. 11, a second heater 10 and a second sensor D included in the second thermal test flip chip FC21 may be electrically connected to the plurality of second bumps 20.

The connection relationship between the first heater 10 and the first sensor D and the plurality of bumps 20 may be the same as described above. As such, a detailed description thereof will not be given.

Next, referring again to FIG. 14, the plurality of first bumps connected to the first heater 10 and the first sensor D may be connected to the first ball array (S300). Referring to FIGS. 8 and 9, the first ball array 50 arranged in the first direction (e.g., in the Y-axis direction) and the plurality of first bumps 20 may be electrically connected to each other. For example, the plurality of first bumps 20 connected to the first heater 10 and the first sensor D may be electrically connected to the plurality of balls 40 included in the first ball array 50 in one-to-one correspondence. Therefore, the number of the plurality of first bumps 20 connected to the first heater 10 and the first sensor D may be equal to the number of the plurality of balls 40 included in the first ball array 50.

If the semiconductor test device further includes a second thermal test flip chip FC21, as shown in FIGS. 11 and 12, the test substrate 30 may include a second ball array 50 disposed on a bottom surface of the test substrate 30. The second ball array 50 electrically connected to the plurality of second bumps 20 of the second thermal test flip chip FC21 may be arranged in the second direction (e.g., in the X-axis direction) to be parallel with the first ball array 50.

The connection relationship between the plurality of bumps 20 and the ball arrays 50 may be the same as described above. Thus, a detailed description thereof will not be given.

While example embodiments have been particularly shown and described with reference to some example embodiments thereof, it will be understood by those of ordinary skill in the art that various changes in form and details may be made therein without departing from the spirit and scope of example embodiments as defined by the following claims. It is therefore desired that the example embodiments be considered in all respects as illustrative and not restrictive, and reference be made to the appended claims rather than the foregoing description to the example embodiments.

What is claimed is:

1. A semiconductor test device comprising:
a first thermal test flip chip cell including a first heater and a first sensor, the first thermal test flip chip cell including a plurality of first bumps arranged on a bottom surface thereof, the plurality of first bumps configured to electrically connect to the first heater and the first sensor; and
a test substrate under the first thermal test flip chip cell, the test substrate including a first ball array arranged on a bottom surface thereof in a first direction, the first ball array configured to electrically connect to the plurality of first bumps.

2. The semiconductor test device of claim 1, wherein the first sensor includes a plurality of sensors.

3. The semiconductor test device of claim 2, wherein the first sensor includes a first sub sensor and second sub sensors, the first sub sensor at a central portion of the first thermal test flip chip cell, and the second sub sensors at two or more of first to fourth corners of the first thermal test flip chip cell.

4. The semiconductor test device of claim 3, wherein the second sub sensors are disposed in a line with respect to the first sub sensor.

5. The semiconductor test device of claim 1, further comprising:
a second thermal test flip chip cell including a second heater and a second sensor, the second thermal test flip chip cell including a plurality of second bumps arranged on a bottom surface of thereof, and the plurality of second bumps electrically connected to the second heater and the second sensor,
wherein the test substrate is under the second thermal test flip chip and includes a second ball array arranged on the bottom surface of the test substrate in the first direction, the second ball array configured to electrically connect to the plurality of second bumps.

6. The semiconductor test device of claim 5, wherein both of the first ball array and the second ball array are arranged in a second direction to be parallel with each other.

7. The semiconductor test device of claim 6, wherein the first ball array and the second ball array include a plurality of first balls and a plurality of second balls arranged in the first direction, respectively, and among the plurality of first balls and the plurality of second balls, balls arranged in the second direction are connected to each other.

8. The semiconductor test device of claim 6, wherein the first direction and the second direction are perpendicular to each other.

9. The semiconductor test device of claim 5, wherein the second thermal test flip chip cell is arranged at one side of the first thermal test flip chip cell.

10. The semiconductor test device of claim 1, wherein the first heater is electrically connected to at least two of the first bumps and the first sensor is electrically connected to at least two of the first bumps.

11. The semiconductor test device of claim 10, wherein the plurality of first bumps are connected to a power supply device and a data collecting device.

12. The semiconductor test device of claim 10, wherein the first ball array includes a plurality of first balls and a number of the plurality of first bumps is different from a number of the plurality of first balls.

13. The semiconductor test device of claim 12, wherein the number of the plurality of first bumps is greater than the number of the plurality of first balls.

14. A semiconductor test device comprising:
at least one thermal test flip chip cell including a heater and at least one sensor, the at least one thermal test flip chip cell including a plurality of bumps arranged on a bottom surface thereof, the plurality of bumps configured to electrically connect to the heater and the at least one sensor; and
a test substrate under the at least one thermal test flip chip cell, the test substrate including at least one ball array arranged on a bottom surface thereof in a first direction, the one ball array configured to electrically connect to the plurality of bumps.

15. The semiconductor test device of claim 14, wherein the heater covers substantial portion of a top surface of the at least one thermal test flip chip cell.

16. The semiconductor test device of claim 14, wherein the at least one thermal test flip chip cell includes a plurality of thermal test flip chip cells, and the plurality of thermal test flip chip cells approximate a size of a semiconductor chip in actual use.

17. The semiconductor test device of claim 15, wherein the at least one ball array includes a plurality of ball arrays, and each of the plurality of ball arrays corresponded to the plurality of bumps configured to electrically connect to the heater and the at least one sensor of each of the plurality of thermal test flip chips.

18. The semiconductor test device of claim 14, wherein the at least one sensor includes a plurality of sensors, each of the plurality of sensors disposed at a center and at some corners of the at least one thermal test flip chip cell.

* * * * *